United States Patent [19]
Yasuda et al.

[11] Patent Number: 5,548,242
[45] Date of Patent: Aug. 20, 1996

[54] WAVEFORM SHAPING CIRCUIT

[75] Inventors: Yukio Yasuda, Itami; Yutaka Ohashi, Himeji, both of Japan

[73] Assignee: Mitsubishi Denki Kabushiki Kaisha, Tokyo, Japan

[21] Appl. No.: 224,885

[22] Filed: Apr. 8, 1994

[30] Foreign Application Priority Data

Apr. 12, 1993 [JP] Japan .................................. 5-084950

[51] Int. Cl.⁶ ................ H03K 5/00; H04B 1/10
[52] U.S. Cl. .................. 327/559; 327/552; 327/551; 327/510; 327/94; 327/100
[58] Field of Search ..................... 327/551, 552, 327/559, 557, 510, 513, 558, 100; 307/652, 650; 342/166, 174; 330/9, 261, 258

[56] References Cited

U.S. PATENT DOCUMENTS

| | | | |
|---|---|---|---|
| 3,832,646 | 8/1974 | Szabo et al. | 330/258 |
| 3,857,104 | 12/1974 | Sacks | 327/553 |
| 4,320,521 | 3/1983 | Balakrishnan et al. | 327/552 |
| 4,459,542 | 7/1984 | Terrier et al. | 327/552 |
| 5,144,231 | 9/1992 | Tenenbaum et al. | 327/510 |
| 5,285,165 | 2/1994 | Renfors et al. | 327/552 |

FOREIGN PATENT DOCUMENTS

| | | |
|---|---|---|
| 63-311815 | 12/1988 | Japan . |
| 165921 | 3/1989 | Japan . |
| 191512 | 4/1989 | Japan . |

OTHER PUBLICATIONS

"Method for Generating Shouldering Distortion on a High Frequency Linewave ", IBM Technical Disclosure Bulletin, vol. 30, No. #2, Jul. 1987, pp. 724–775.

*Primary Examiner*—Timothy P. Callahan
*Assistant Examiner*—Dinh T. Le
*Attorney, Agent, or Firm*—Leydig, Voit & Mayer

[57] ABSTRACT

A waveform shaping circuit shapes a waveform by comparing an output signal generated by an electromagnetic coil in response to a change in an incident magnetic flux to a reference voltage in a comparator. The circuit prevents waveform shaping error due to rapid fluctuations in the output signal. The waveform shaping circuit includes a high-pass filter that removes low-frequency components having frequencies not higher than a cut-off frequency from the output signal of the electromagnetic coil and that has at least two different attenuation characteristics with respective cut-off frequencies, a voltage limiting circuit for switching between the attenuation characteristics of the filter in response to the amplitude of the output signal of the electromagnetic coil by limiting the amplitude of the output signal to a maximum voltage, and a comparator for comparing the filtered output signal with a reference voltage and generating a shaped output signal in response.

6 Claims, 6 Drawing Sheets

WAVEFORM SHAPING CIRCUIT

BACKGROUND OF THE INVENTION

1. Field of the Invention

This invention relates to a waveform shaping circuit for shaping an AC output signal generated by an electromagnetic coil in response to a change in incident magnetic flux density in a sensor for detecting the rotational position of a rotating shaft such as a crankshaft of an engine.

2. Description of the Related Art

FIG. 10 is a schematic diagram showing a known rotation sensor for detecting the rotational position of a rotating shaft 100a such as a crankshaft of an engine. In this Figure, a disc 100 having a large number of peripheral teeth arranged circumferentially at equal intervals, is firmly attached to the rotating shaft 100a, and an electromagnetic pick-up in the form of an electromagnetic coil 101 is spaced from the outer periphery of the disc 100 by a predetermined distance. When the rotating shaft 100a and the disc 100 rotate, the distance between the outer periphery of the disc 100 and the electromagnetic coil 101 varies, thereby varying the magnetic flux extending through the electromagnetic coil 101. That is, each time a tooth on the outer periphery of the disc faces the electromagnetic coil 101, the electromagnetic coil 101 generates an AC output signal. The output signals generated in this way by the electromagnetic coil 101 are shaped by a waveform shaping circuit provided on the electromagnetic coil 101 into rectangular waves, which are input to a control unit in the form of a microcomputer or the like (not shown). The control unit calculates the rotational position of the rotating shaft 100a on the basis of the signals shaped by the waveform shaping circuit, thereby controlling ignition timing, fuel injection timing, etc., of the associated engine.

FIG. 11 is a circuit diagram showing a conventional waveform shaping circuit for use with a rotation sensor like the one shown in FIG. 10. Referring to the drawing, connected to the opposite ends of the electromagnetic coil 101 are a low-pass filter and a high-pass filter. The low-pass filter comprises a resistor 102 and a capacitor 103 for removing high-frequency waves having a frequency not lower than a predetermined frequency. The high-pass filter comprises a capacitor 104 and a resistor 105 for removing low-frequency waves having a frequency not higher than a predetermined frequency. Connected in parallel to the opposite ends of the resistor 105 of the high-pass filter are diodes 106 and 107 of opposite polarities. When the voltage across the resistor 105 reaches a predetermined value, the diodes 106 and 107 become conductive, thereby preventing the voltage across the resistor 105 from exceeding the predetermined value. The node of the capacitor 104 and the resistor 105 of the high-pass filter is connected to an inverted input terminal of a comparator 108. A non-inverted input terminal of the comparator 108 is connected through a resistor 109 to one end of the electromagnetic coil 101 and, at the same time, to a reference voltage source 111. The reference voltage source 111 provides a bias such that the voltage of a signal B input to the inverted input terminal of the comparator 108 is within the operating input range of the comparator 108 and, at the same time, it supplies a reference voltage to the non-inverted input terminal of the comparator 108 through a resistor 109. The output terminal of the comparator 108 is connected to a control unit in the form of a microcomputer and, at the same time, to the non-inverted input terminal of the comparator 108 through a resistor 110.

FIGS. 12 and 13 show the signal waveforms in different sections of the waveform shaping circuit during low-speed rotation and high-speed rotation, respectively, of the rotating shaft 100a. In these Figures, symbol A indicates the output signal of the electromagnetic coil 101; symbol B indicates the signal waveform at the node of the capacitor 104 and the resistor 105; and symbol C indicates the output signal waveform of the comparator 108.

Next, the operation of the above-described waveform shaping circuit will be described with reference to FIGS. 12 and 13. First, when the rotating shaft 100a is rotated to cause the disc 100 to rotate, the flux density of the magnetic flux extending through the electromagnetic coil 101, which serves as the signal source, is changed to generate an induced electromotive force, by means of which the electromagnetic coil 101 generates an AC output signal A. The greater the change in the flux density per unit time, the larger the amplitude of this output signal A. For example, when the rotating speed of the rotating shaft 100a is 40 r.p.m., the amplitude of the output signal A is approximately 1 V, whereas, when the rotating speed is 8000 r.p.m, the amplitude is as large as 180 V. Further, since noise is superimposed on the output signal of the electromagnetic coil 101, it is necessary to remove such noise with the high-pass filter and the low-pass filter. The low-pass filter comprising the resistor 102 and the capacitor 103 removes high-frequency noise components having a frequency not lower than a predetermined frequency included in the output signal A of the electromagnetic coil 101. The high-pass filter comprising the resistor 105 and the capacitor 104 removes low-frequency noise components having a frequency not higher than a predetermined frequency.

When the amplitude (i.e., voltage) of the output signal A of the electromagnetic coil 101, which increases in proportion to the rotating speed of the rotating shaft 100a, exceeds the diode forward ON voltage (approximately 700 mV), the diodes 106 and 107 become conductive and restrict the amplitude, i.e., the voltage, of the signal at the node of the capacitor 104 and the resistor 105 to a level not higher than the diode forward ON voltage (approximately 700 mV) so that the voltage is prevented from exceeding the operating voltage of the comparator 108 (see B in FIGS. 12 and 13).

The signal B, from which high-frequency and low-frequency noise components have been removed by the low-pass filter comprising the resistor 102 and the capacitor 103 and by the high-pass filter comprising the resistor 105 and the capacitor 104, is input to the inverted input terminal of the comparator 108 and compared with a reference voltage R that is applied to the non-inverted input terminal. As shown in FIGS. 10 and 11, the output signal C of the comparator 108 is at a high level when the input signal B is lower than the reference voltage R, and at a low level when the input signal B is higher than the reference voltage R.

The output signal C of the comparator C thus waveform-shaped is input to a control unit such as a microcomputer (not shown) and used to control ignition timing, fuel injection timing, of an associated engine and, at the same time, it is fed back to the non-inverted input terminal of the comparator 108 through the resistor 110, thereby imparting a hysteresis to the comparing operation of the comparator 108 so as to prevent the waveform of the output signal C from being disturbed by noise.

In the conventional waveform shaping circuit described above, the high-pass filter, formed by the resistor 105 and the capacitor 104, operates effectively only in a relatively small frequency range, so that, when the rotating shaft 100a rotates at high speed increasing the frequency of the output signal A of the electromagnetic coil 101, the high-pass filter ceases to operate effectively. As a result, when, as shown in FIG. 13, the waveform of the output signal A is disturbed due to an abnormal tooth thickness of the disc 100, etc., and the input signal B of the comparator 108 ceases to exceed the reference voltage R, a waveform shaping error (pulse defect) Ce is generated in the output signal C. To eliminate this waveform shaping error, it is necessary to quickly attenuate the waveform fluctuations when an error signal is generated. However, with the conventional waveform shaping circuit described above, it is impossible to satisfy such a requirement over the entire signal frequency range, which is rather large.

SUMMARY OF THE INVENTION

It is an object of this invention to provide a waveform shaping circuit for signals of a wide frequency range which can prevent a waveform shaping error due to an abnormal signal as described above, thereby achieving an improvement in reliability.

According to the present invention, there is provided a waveform shaping circuit comprising: an electromagnetic coil for generating an AC output signal in response to a change in magnetic flux density; filter means for removing low-frequency components not higher than a predetermined frequency from the AC output signal of the electromagnetic coil, the filter means having an attenuation characteristic varying in two or more stages in accordance with the amplitude of the output signal of the electromagnetic coil; a voltage limiting circuit for switching over the attenuation characteristic of the filter means in accordance with the output signal of the electromagnetic coil to thereby control the output signal of the electromagnetic coil in such a manner that it does not exceed a predetermined voltage; and a comparator for comparing the output signal of the electromagnetic coil, from which low-frequency components have been removed by the filter means, with a reference voltage to generate an output signal.

With the above construction, the output signal of the electromagnetic coil, input to the comparator, is limited in such a manner that the level of the output signal does not exceed the predetermined voltage, and at the same time, the attenuation characteristic of the filter means is changed in two or more stages in accordance with the amplitude of the electromagnetic coil, thereby preventing a waveform shaping error of the comparator due to rapid fluctuations of the output signal of the electromagnetic coil.

In a preferred form of the invention, the above-mentioned filter means comprises: a first high-pass filter for removing low-frequency components not higher than a first predetermined frequency from the output signal of the electromagnetic coil; and a second high-pass filter for removing low-frequency components higher than the first predetermined frequency but lower than a second predetermined frequency from the output signal of the electromagnetic coil.

In another preferred form of the invention, the filter means comprises: a first high-pass filter for removing low-frequency components not higher than a first predetermined frequency from the output signal of the electromagnetic coil; a second high-pass filter for removing low-frequency components higher than the first predetermined frequency but lower than a second predetermined frequency from the output signal of the electromagnetic coil; and a third high-pass filter for increasing the effective frequency range of the second high-pass filter. Thus, by enlarging the effective frequency range of the second high-pass filter by the third high-pass filter, it is possible to effectively remove low-frequency components over a wide range.

DESCRIPTION OF THE PREFERRED EMBODIMENTS

First Embodiment

Figure 1:
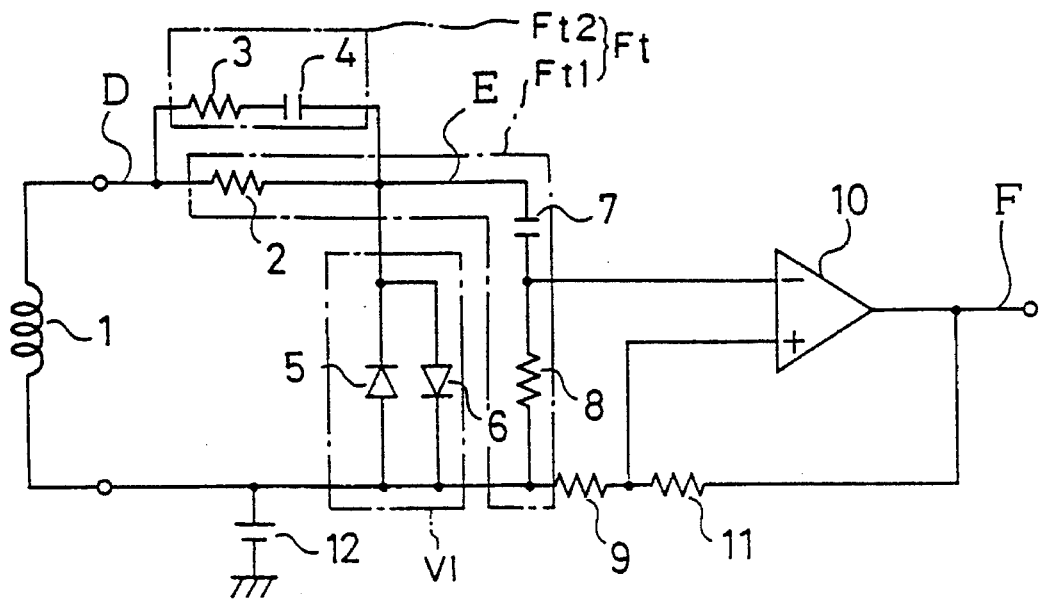
FIG. 1 is a circuit diagram showing a waveform shaping circuit according to a first embodiment of the present invention.
Figure 10:
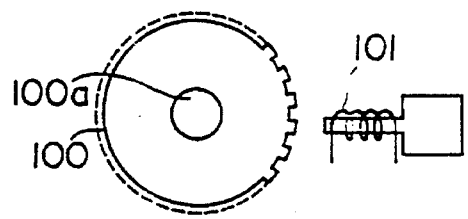
FIG. 10 is a schematic side view of a conventional rotation sensor.
Figure 11:
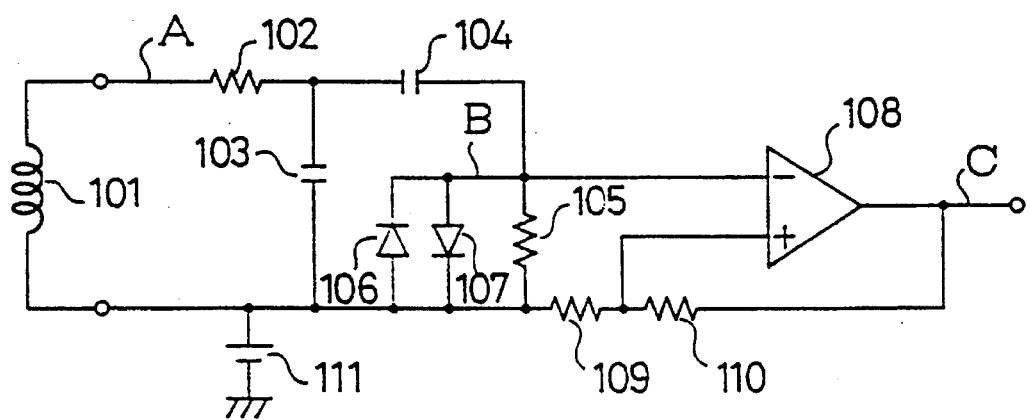
FIG. 11 is a circuit diagram showing a conventional waveform shaping circuit.
Figure 12:
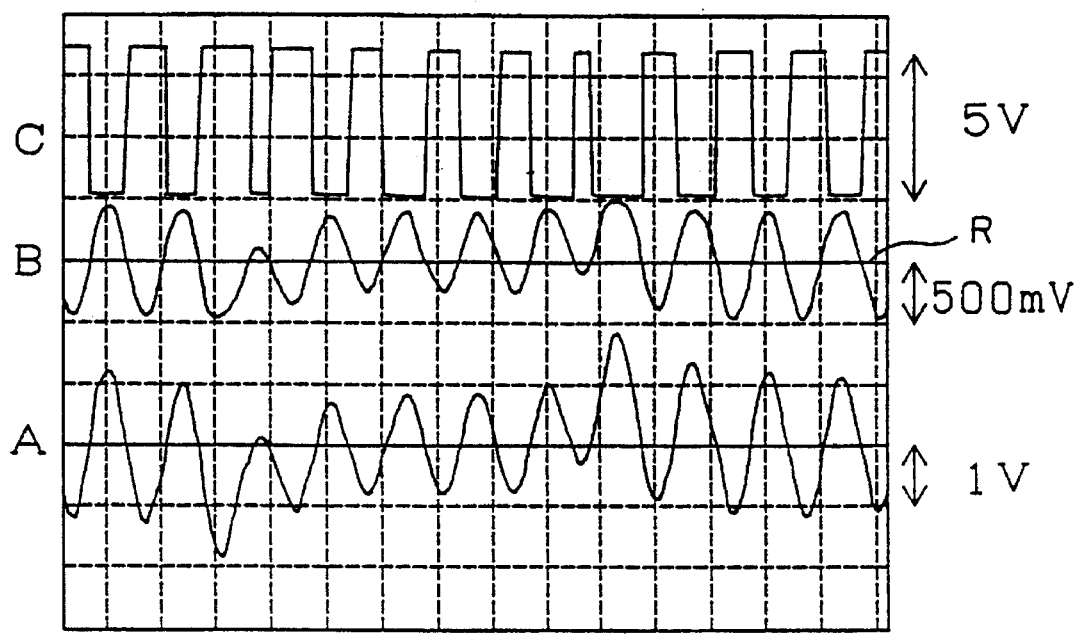
FIG. 12 is a waveform chart showing the signal waveforms in different sections of the waveform shaping circuit of FIG. 11 during low-speed rotation of the associated rotating shaft.
Figure 13:
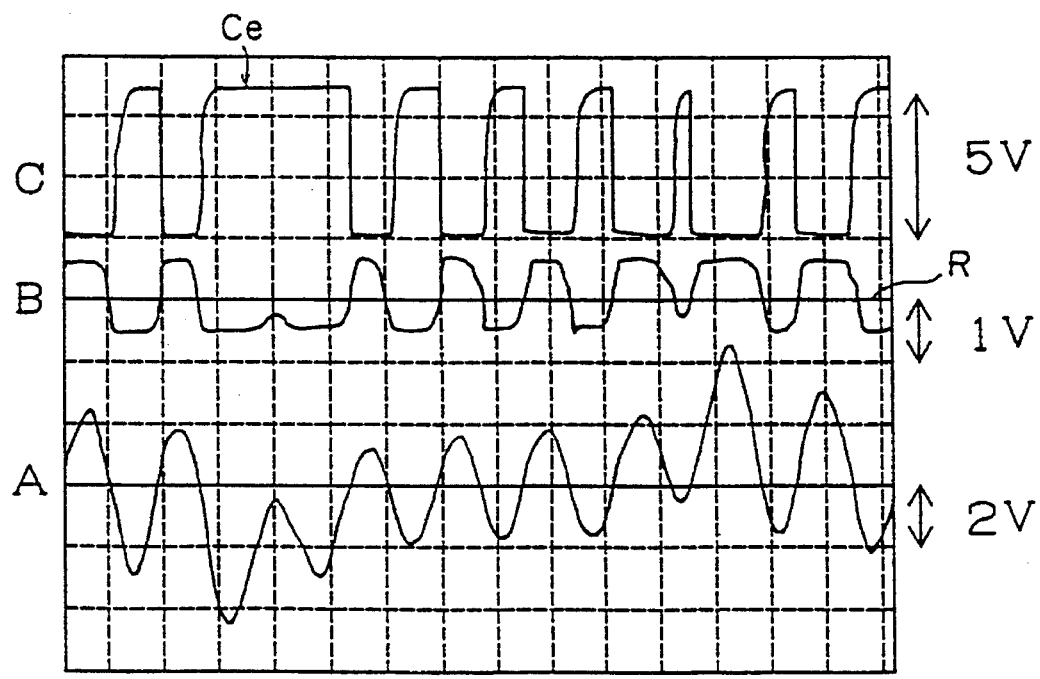
FIG. 13 is a waveform chart showing the signal waveforms in different sections of the waveform shaping circuit of FIG. 11 during high-speed rotation of the associated rotating shaft.

Embodiments of this invention will now be described with reference to the accompanying drawings. FIG. 1 is a circuit diagram showing a waveform shaping circuit according to the first embodiment of the present invention. Like the aforesaid example described with reference to FIG. 11, the waveform shaping circuit of the present invention is suitable for use with a rotation sensor for detecting the rotational position of a rotating shaft such as an engine crankshaft as shown in FIG. 10, but is also applicable to any other type of rotation sensor which generates an AC output signal in response to a change in magnetic flux density. In the following, the waveform shaping circuit of the present invention will be described as applied to the rotation sensor of FIG. 10.

Referring to FIG. 1, the waveform shaping circuit as illustrated is constructed as follows. An electromagnetic coil 1 generates an AC output signal in incident response to a change in magnetic flux density. A filter means Ft removes low-frequency components having a frequency not higher than a predetermined frequency contained in the AC signal D to output from the electromagnetic coil 1. The filter means Ft has an attenuation characteristic having two or more stages in accordance with the amplitude of the output signal D of the electromagnetic coil 1. A voltage limiting circuit V1 switches the attenuation characteristic of the filter means Ft between stages in accordance with the output signal D of the electromagnetic coil 1, whereby the circuit V1 limits the level of the output signal D such that it does not exceed a predetermined voltage. A comparator 10 compares an output signal E, obtained by removing low-frequency components from the output signal D of the electromagnetic coil 1 by means of the filter means Ft, with a reference voltage to thereby generate an output signal F.

The filter means Ft comprises a first high-pass filter Ft1 for removing low-frequency components having a frequency not higher than a first predetermined frequency from the output signal D of the electromagnetic coil 1, and a second high-pass filter Ft2 for removing low-frequency components having a frequency higher than the first predetermined frequency but lower than a second predetermined frequency from the output signal D of the electromagnetic coil 1.

The first high-pass filter Ft1 is composed of a resistor 2, a capacitor 7 and a resistor 8, all of which are connected in series to each other between the opposite ends of the electromagnetic coil 1.

The second high-pass filter Ft2 is composed of a resistor 3 and a capacitor 4 which are connected in series to each other the series connected components being connected in parallel with the resistor 2. In order for the operating frequency of the second high-pass filter Ft2 to be higher than that of the first high-pass filter Ft1, the capacitance of the capacitor 4 is less than the capacitance of the capacitor 7.

The voltage limiting circuit V1 is composed of a pair of diodes 5 and 6 which are connected in parallel to the series connection of the capacitor 7 and the resistor 8. The diodes 5 and 6 are connected in parallel to each other with opposite polarities.

The inverted input terminal of the comparator 10 is connected to the node of the capacitor 7 and the resistor 8, while the non-inverted input terminal of the comparator is connected through a resistor 9 to one end of the electromagnetic coil 1 and to a reference voltage source 12. The output terminal of the comparator 10 is connected to a control unit in the form of a microcomputer and, at the same time, to the non-inverted input terminal of the comparator 10 through a resistor 11. Accordingly, the output signal F of the comparator 10 is fed back to the non-inverted input terminal thereof through the resistor 11 to impart a hysteresis to the comparing operation of the comparator 10, thereby preventing the waveform of the output signal F from being disturbed by high-frequency noise components superimposed on the output signal D of the electromagnetic coil 1.

The reference voltage source 12 provides a bias such that the voltage of the signal E input to the inverted input terminal of the comparator 10 is within the operating input range of the comparator 10 and, at the same time, it supplies a reference voltage R to the non-inverted input terminal of the comparator 10 through the resistor 9.

Figure 2:
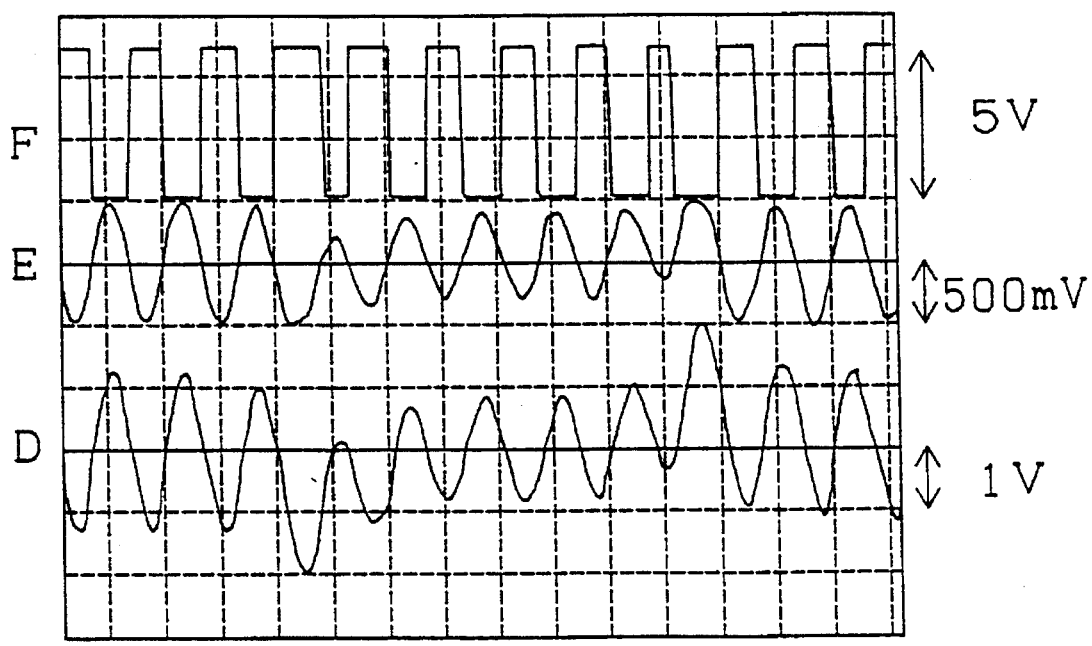
FIG. 2 is a waveform chart showing the signal waveforms in different sections of the waveform shaping circuit of FIG. 1 during low-speed rotation of the associated rotating shaft.
Figure 3:
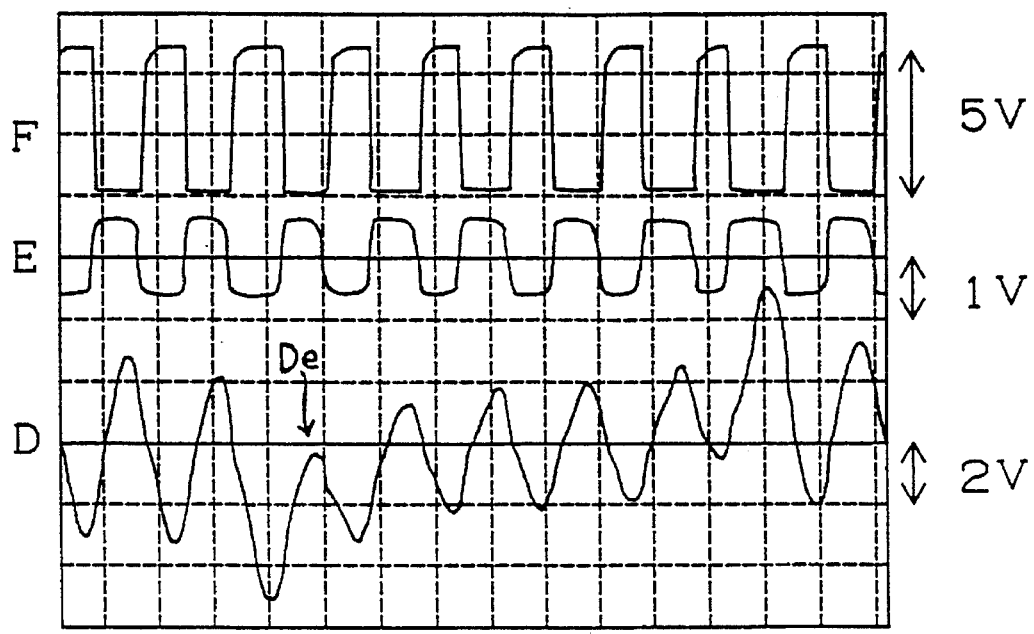
FIG. 3 is a waveform chart showing the signal waveforms in different sections of the waveform shaping circuit of FIG. 1 during high-speed rotation of the associated rotating shaft.

FIGS. 2 and 3 show the signal waveforms in different sections of the waveform shaping circuit of FIG. 1 when a variation in the magnetic flux incident on the electromagnetic coil 1 is small (during low-speed rotation of the rotating shaft) and when the variation is large (during high-speed rotation of the shaft), respectively. In the drawings, symbol D indicates the output signal of the electromagnetic coil 1; symbol E indicates the signal waveform at the node of the resistor 2 and the capacitors 4 and 7; and symbol F indicates the output signal waveform of the comparator 10.

Figure 4:
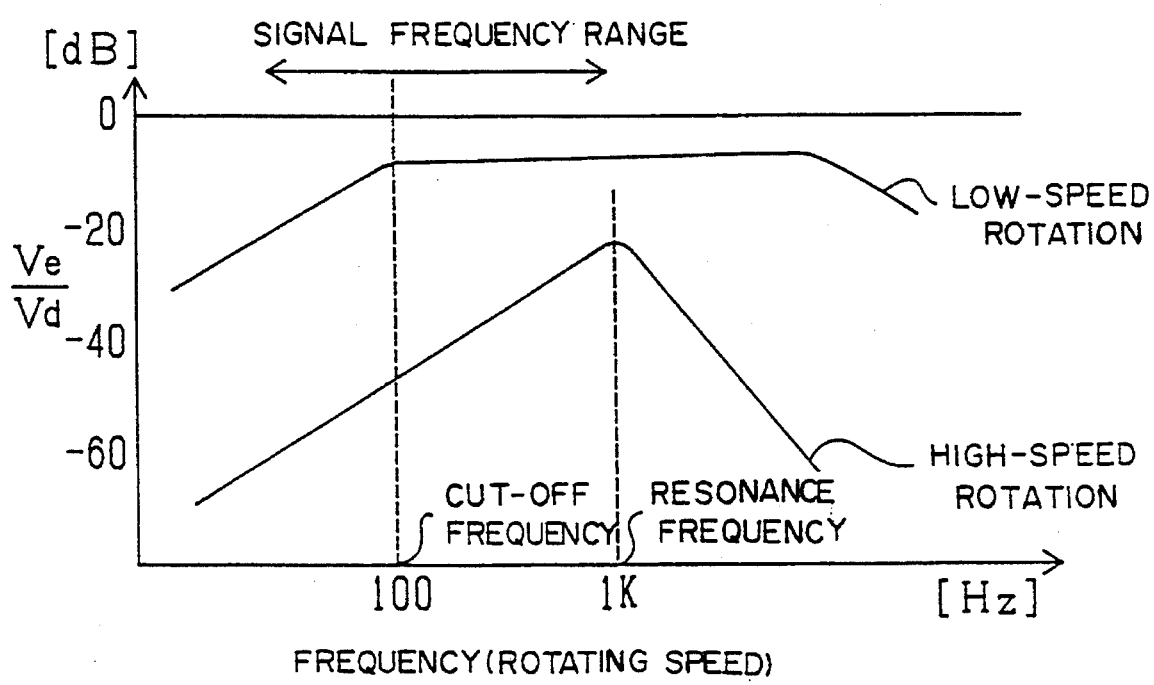
FIG. 4 is a graph showing the attenuation characteristics of the waveform shaping circuit of FIG. 1.

FIG. 4 is a graph showing the attenuation characteristics of the filter means Ft of the waveform shaping circuit of FIG. 1 during low-speed and high-speed rotation of the rotating shaft. In FIG. 4, the ordinate indicates the ratio the AC component voltage Ve of the waveform of the signal E to the AC component voltage Ve of the waveform of the output signal D of the electromagnetic coil 1 (VeNd), and the abscissa indicates the frequency of the output signal D of the electromagnetic coil 1 (the rotating speed per unit time of the rotating shaft).

Next, the operation of the waveform shaping circuit of FIG. 1 as described above will be explained with reference to FIGS. 2, 3 and 4. First, as shown in FIG. 10, when the disc 100 rotates together with the rotating shaft 100a, the magnetic flux, incident on the magnetic coil 1 as the signal source, changes and generates an induced electromotive force so that the electromagnetic coil 1 generates an AC output signal D. The larger the variation in the magnetic flux density per unit time, the greater becomes the amplitude of this output signal D. Further, since noise is superimposed on the output signal D of the electromagnetic coil 1, it is necessary to remove the noise with the filter means Ft.

As the rotating speed of the rotating shaft 100a increases, the amplitude (i.e., voltage) of the output signal D of the electromagnetic coil 1 increases. When this amplitude exceeds the diode forward ON voltage (approximately 700 mV), the diodes 5 and 6 become conductive, with the result that the amplitude, i.e., the voltage, of the signal E at the node of the resistor 2 and the capacitors 3 and 4 is limited to a level not higher than the diode forward ON voltage (approximately 700 mV) that does not exceed the operating voltage of the comparator 10 (see "E" in FIGS. 2 and 3).

In the low-frequency range in which the diodes 5 and 6, which limit the voltage of the input signal E of the comparator 10 to a level not higher than a predetermined value, do not conduct, the attenuation characteristic of the first high-pass filter Ft1, composed of the resistors 2 and 8 and the capacitor 7, predominantly affects the output signal D. The amplitude of the output signal D of the electromagnetic coil 1 is proportional to the frequency of the output signal D. Since the frequency of the output signal D at this time is low, the cut-off frequency of the first high-pass filter Ft1 may be low. This cut-off frequency is set at, for example, 100 Hz, as shown in FIG. 4. Further, as shown in FIG. 4, the attenuation characteristic of the first high-pass filter Ft1 is flat at a frequency higher than the cut-off frequency, so it does not have any effective filter effect.

When the rotating speed of the rotating shaft 100a increases, and the frequency of the output signal D of the electromagnetic coil 1 is increased (i.e., in the high-speed rotation range), the attenuation characteristic due to the LCR resonance circuit, composed of the electromagnetic coil 1, the resistor 3 and the capacitor 4, predominantly affects the output signal D. As indicated by the attenuation characteristic at high-speed rotation in FIG. 4, the LCR resonance circuit functions as a high-pass filter for a signal having a frequency not higher than the resonance frequency (e.g., 1 KHz).

As described above, by setting the cut-off frequency of the first high-pass filter Ft1 and the resonance frequency of the LCR resonance circuit to appropriate values, it is possible to change the characteristics of the filter means Ft in accordance with the amplitude of the output signal D of the electromagnetic coil 1. Accordingly, the effective operating range of the first high-pass filter Ft1 is in a frequency range not higher than the cut-off frequency. However, by using the LCR resonance circuit in combination with the first high-pass filter Ft1, it is possible to enlarge the effective operating range of the filter means Ft to a range higher than the cut-off frequency but not higher than the resonance frequency of the LCR resonance circuit. Thus, as shown in FIG. 3, if, during high-speed rotation of the rotating shaft 100a, an abnormal waveform De is generated in the output signal D of the electromagnetic coil 1 due to noise components higher than the cut-off frequency, the noise components are removed by the LCR resonance circuit, so that no waveform shaping error (pulse defect) appears in the input signal E of the comparator 10, thereby making it possible to obtain an input signal E having a normal waveform.

The signal E, from which noise has been removed by the filter means Ft, is input to the inverted input terminal of the comparator 10 and compared with the reference voltage R, which is applied to the non-inverted input terminal. As shown in FIGS. 2 and 3, the output signal F of the comparator 10 is at a high level when the level of the input signal E is lower than the reference voltage R, and at a low level when the level of the input signal E is higher than the reference voltage R.

The output signal F of the comparator 10 thus waveform-shaped is input to a control unit such as a microcomputer (not shown) for controlling the fuel ignition timing, fuel injection timing, of an associated engine and, at the same time, it is fed back through the resistor 11 to the non-inverted input terminal of the comparator 10 to impart a hysteresis to the comparing operation of the comparator 10, thereby preventing the waveform of the output signal F from being disturbed by high-frequency noise components. The width of the hysteresis due to the feedback of the output signal F of the comparator 10 is less than the forward ON voltage of the diodes 5 and 6.

The diodes 5 and 6 limit the voltage of the input signal E of the comparator 10 to a level not higher than a predetermined value and, at the same time, as a switch so that the second high-pass filter Ft2, utilizing the characteristics of the LCR resonance circuit, becomes effective.

Second Embodiment

Figure 5:
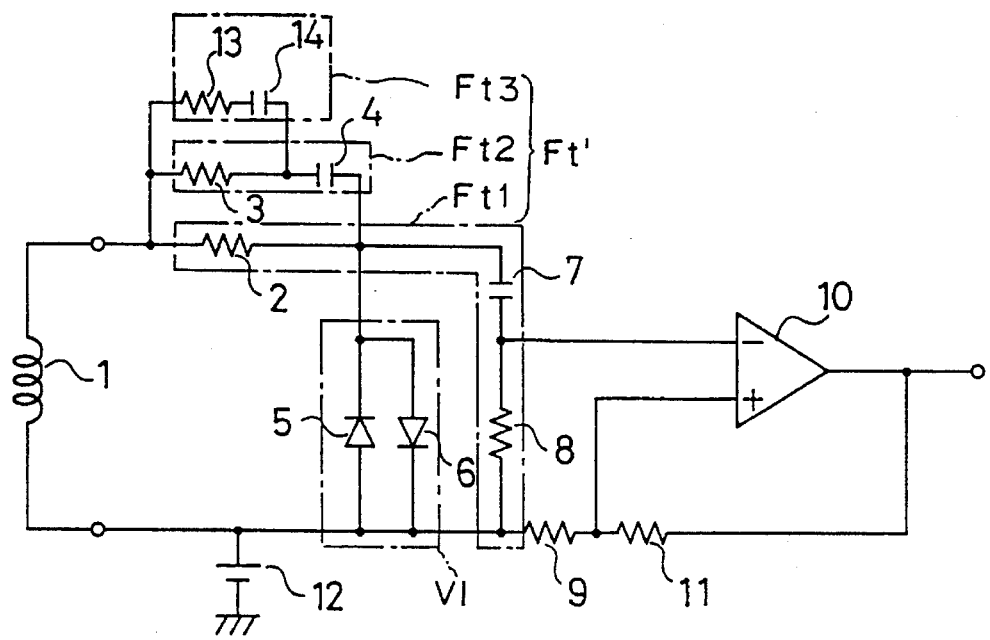
FIG. 5 is a circuit diagram showing a waveform shaping circuit according to a second embodiment of the present invention.
Figure 6:
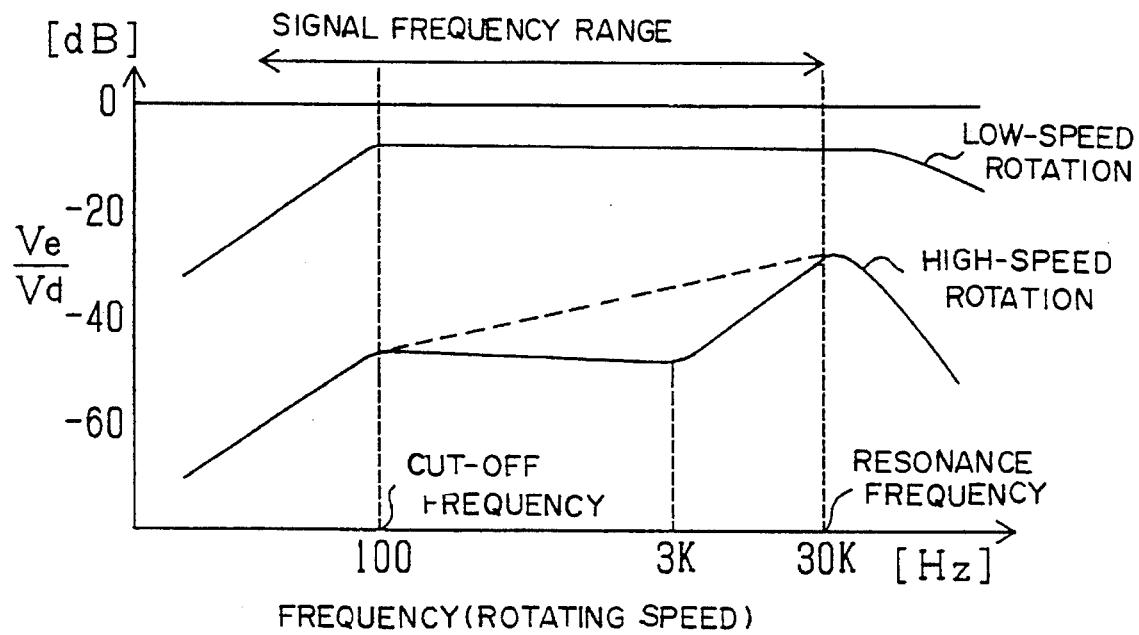
FIG. 6 is a graph showing the attenuation characteristics of the waveform shaping circuit of FIG. 5.

FIG. 5 is a circuit diagram showing a waveform shaping circuit according to a second embodiment of the present invention. In this embodiment, the effective frequency range of the filter means Ft of the first embodiment is increased. As shown in FIG. 4, when the frequency range of the output signal D of the electromagnetic coil 1 is low enough (e.g., not higher than 1 KHz), the filter means Ft functions effectively from low-speed to high-speed rotation, whereas, when the frequency range of the output signal D is wide (e.g., 30 kHz or less), it is necessary to increase the resonance frequency of the LCR resonance circuit up to the maximum of the frequency range concerned (e.g., 30 kHz). As shown in FIG. 6, a range where the effect of the filter means Ft diminishes is generated in the intermediate frequency range (e.g., from 100 Hz to 3 kHz), and a signal defect is liable to occur in this range. In view of this, the second embodiment improves the function of the filter means in the intermediate frequency range.

Referring to FIG. 5, the waveform shaping circuit according to this embodiment has the same construction as that of the first embodiment shown in FIG. 1 except that a third high-pass filter Ft3, composed of a resistor 13 and a capacitor 13 connected in series to each other, is connected in parallel to the resistor 3. The filter means Ft' of this embodiment is composed of the first high-pass filter Ft1, the second high-pass filter Ft2 and the third high-pass filter Ft3.

In the second embodiment, as is apparent from FIG. 6, it is mainly the first high-pass filter Ft1 that is effective in the low-speed rotating range, in which the diodes 5 and 6 do not conduct, so that the attenuation characteristics in this embodiment are substantially the same as those in the first embodiment. However, in the high-speed rotation range, in which the diodes 5 and 6 conduct, it is possible to increase the resonance frequency of the LCR resonance circuit, composed of the electromagnetic coil and the second and third high-pass filters Ft2 and Ft3, to a desired frequency (e.g., 30 KHz). Further, since the high-pass filtering effect due to the third high-pass filter Ft3 increases as the frequency of the output signal D of the electromagnetic coil 1 increases, it is possible to obtain an attenuation characteristic that increases gradually from the cut-off frequency of the first high-pass filter Ft1 (e.g., 100 Hz) to the resonance frequency of the LCR resonance circuit (e.g., 30 kHz). Accordingly, even when the frequency range of the output signal D of the electromagnetic coil 1 has increased (e.g., from 100 Hz to 30 kHz), it is possible to obtain a satisfactory high-pass filtering characteristic over the entire frequency range. Thus, in the intermediate frequency range from the cut-off frequency (e.g., 100 Hz), at which the filtering effect of the first high-pass filter Ft1 diminishes, to the frequency (e.g., 3 kHz) at which the filtering effect of the second high-pass filter Ft2 starts to appear, no waveform shaping error is generated in the input signal E of the comparator 10 even if an abnormal waveform is generated in the output signal D of the electromagnetic coil 1, so that it is possible to prevent a signal defect from occurring to the output signal F of the comparator 10.

Apart from what has been described above, the effect of the second embodiment is substantially the same as that of the first embodiment.

Third Embodiment

Figure 7:
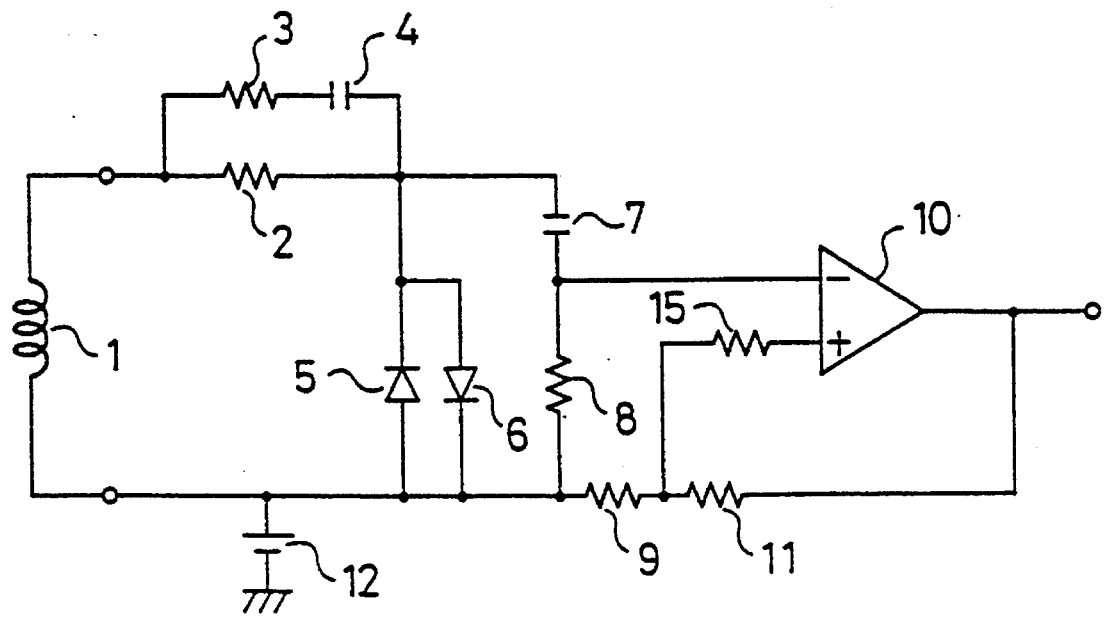
FIG. 7 is a circuit diagram showing a waveform shaping circuit according to a third embodiment of the present invention.

FIG. 7 shows a waveform shaping circuit according to the third embodiment of the present invention. The waveform shaping circuit of this embodiment has the same construction as that of the first embodiment except that a resistor 15 having the same resistance value as the resistor 8 is connected between the non-inverted input terminal of the comparator and the node of the resistors 9 and 11. This embodiment provides the following advantage: when the resistance value of the resistor 8 is increased upon setting a circuit constant, a voltage drop is caused by the input bias current due to the construction of the input circuit, thereby generating an offset in the comparison voltage of the comparator 10. This offset in the comparison voltage can be mitigated by the resistor 15.

Fourth Embodiment

Figure 8:
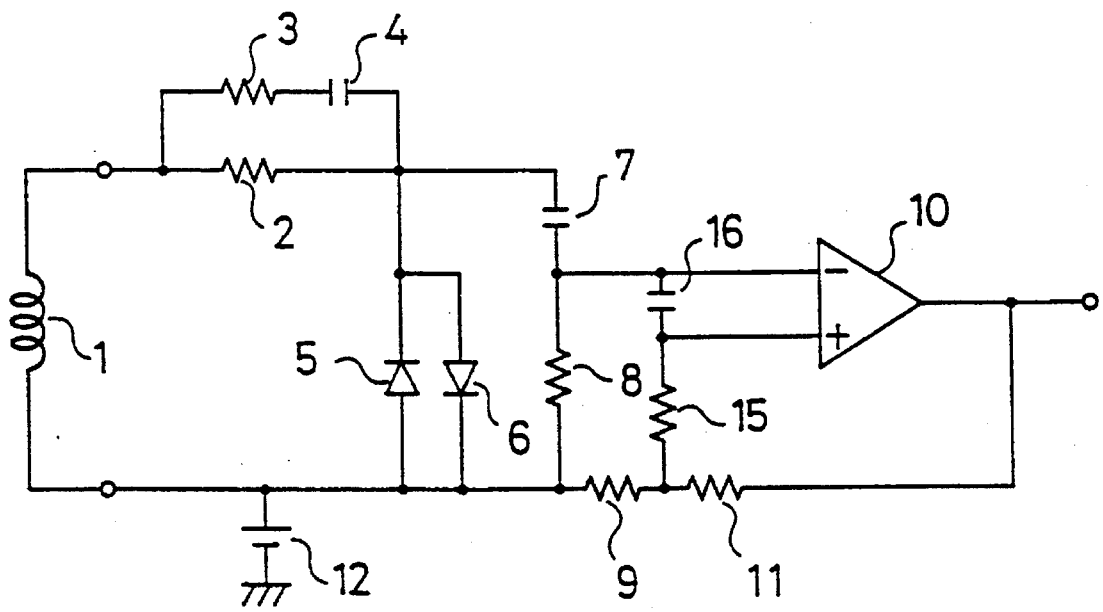
FIG. 8 is a circuit diagram showing a waveform shaping circuit according to a fourth embodiment of the present invention.

FIG. 8 shows a waveform shaping circuit according to the fourth embodiment of the present invention. The waveform shaping circuit of this embodiment has the same construction as that of the third embodiment except that a capacitor 16 is connected between the inverted and non-inverted terminals of the comparator 10 and that the resistor 15 and the capacitor 16 are connected in series to each other to form a low-pass filter. In this embodiment, the resistor 15 for diminishing the offset in the comparison voltage of the comparator 10 is used to form a low-pass filter. Thus, the resistor 15 can be used for both the removal of high-frequency noise components and the reduction in the offset of the comparison voltage.

Fifth Embodiment

Figure 9:
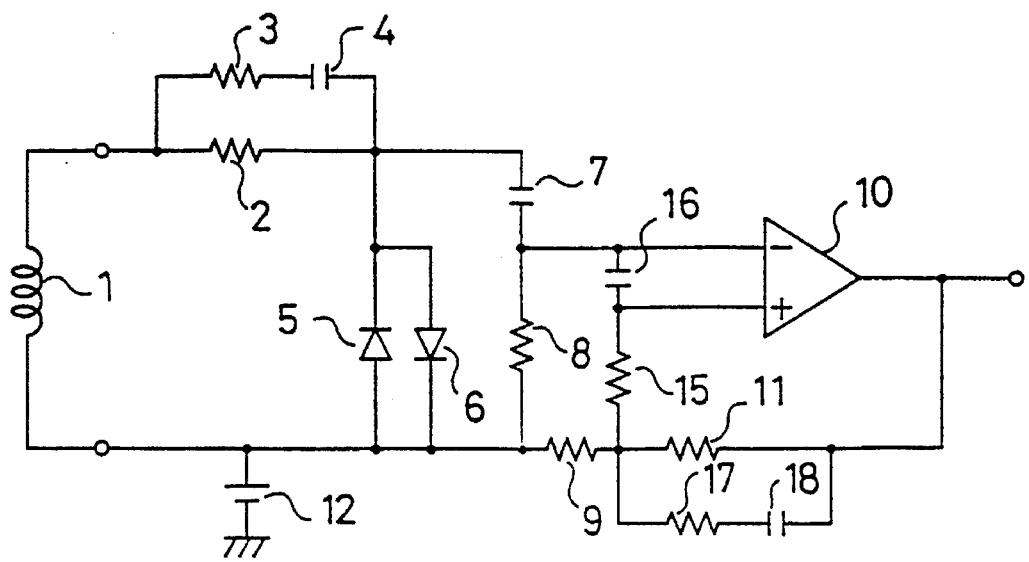
FIG. 9 is a circuit diagram showing a waveform shaping circuit according to a fifth embodiment of the present invention.

FIG. 9 shows a waveform shaping circuit according to the fifth embodiment of the present invention. The waveform shaping circuit of this embodiment has the same construction as that of the fourth embodiment except that a resistor 17 and a capacitor 18 connected in series to each other are connected in parallel to the resistor 11. According to this embodiment, the hysteresis in the comparing operation of the comparator 10 is increased by the effect of the capacitor 18 when the level of the output signal of the comparator 10 is switches, thereby making it possible to reduce the probability of a malfunction of the comparator 10 due to high-frequency noise components superimposed on the low-frequency signal output from the electromagnetic coil 1.

As described above, in accordance with this invention, the waveform shaping circuit is constructed such that it comprises: an electromagnetic coil for generating an AC output signal in response to a change in magnetic flux density; filter means which removes low-frequency components not higher than a predetermined frequency from the AC output signal of the electromagnetic coil and which has an attenuation characteristic which varies in two or more stages in accordance with the amplitude of the output signal of the electromagnetic coil; a voltage limiting circuit which switches the attenuation characteristic of the filter means in accordance with the output signal of the electromagnetic coil and which controls the output signal of the electromagnetic coil in such a way that it does not exceed a predetermined voltage; and a comparator for comparing the output signal of the electromagnetic coil, from which low-frequency components have been removed by the filter means, with a reference voltage to generate an output signal. With this construction, a high-pass filter is obtained which is effective or valid for the output signals of an electromagnetic coil in a wide frequency range. Accordingly, it is possible to effectively prevent a waveform shaping error in the comparator, i.e., a signal defect in the output signal, even when the electromagnetic coil has generated an abnormal signal causing a rapid change in the signal level, thereby making it possible to enhance the reliability in operation of the waveform shaping circuit.

What is claimed is:

1. The waveform shaping circuit comprising:

an electromagnetic coil for generating an AC output signal that varies in amplitude in response to a change in an incident magnetic flux;

filter means coupled to said electromagnetic coil for removing low-frequency components having frequencies not higher than a cut-off frequency from the AC output signal of said electromagnetic coil, said filter means producing a filtered output signal and comprising:

a first high-pass filter coupled to said electromagnetic coil and said voltage limiting circuit and having a first attenuation characteristic for removing low-frequency components having frequencies not higher than a first cut-off frequency from the AC output signal of said electromagnetic coil, said first high-pass comprising a first resistor, a first capacitor, and a second resistor connected in series, said first resistor, first capacitor, and second resistor connected in series being connected in parallel with said electromagnetic coil; and a second high-pass filter coupled to said electromagnetic coil and said voltage limiting circuit and having a second attenuation characteristic for removing low-frequency components having frequencies higher than the first cut-off frequency and lower than a second cut-off frequency, the second cut-off frequency being higher than the first cut-off frequency, from the AC output signal of said electromagnetic coil, said second high-pass filter comprising a third resistor and a second capacitor connected in series, said third resistor and second capacitor being connected in parallel with said first resistor;

a voltage limiting circuit coupled to said electromagnetic coil and said filter means for switching between the attenuation characteristics of said filter means in response to the amplitude of the AC output signal of said electromagnetic coil by limiting the amplitude of the AC output signal of said electromagnetic coil so that the AC output signal does not exceed a maximum voltage; and a comparator having first and second input terminals for comparing the filtered output signal with a reference voltage and generating a shaped output signal in response, a node connecting said first capacitor to said second resistor being connected to the first input terminal of said comparator and a node connecting said electromagnetic coil to said second resistor being connected to the second input terminal of said comparator.

2. The waveform shaping circuit according to claim 1 wherein said voltage limiting circuit comprises a pair of diodes connected to each other in reverse polarity and in parallel with said series-connected first capacitor and second resistor.

3. The waveform shaping circuit according to claim 1 wherein the capacitance of said second capacitor is less than the capacitance of said first capacitor.

4. A waveform shaping circuit comprising:

an electromagnetic coil for generating an AC output signal that varies in amplitude in response to a change in an incident magnetic flux;

filter means coupled to said electromagnetic coil for removing low-frequency components having frequencies not higher than a cut-off frequency from the AC output signal of said electromagnetic coil, said filter means producing a filtered output signal and comprising:

a first high-pass filter coupled to said electro-magnetic coil and said voltage limiting circuit and having a first attenuation characteristic for removing low-frequency components having frequencies not higher than a first cut-off frequency from the AC output signal of said electromagnetic coil, said first high-pass filter comprising a first resistor, a first capacitor, and a second resistor connected in series, said first resistor, first capacitor, and second resistor connected in series being connected in parallel with said electromagnetic coil;

a second high-pass filter coupled to said electro-magnetic coil and said voltage limiting circuit and having a second attenuation characteristic for removing low-frequency components having frequencies higher than the first cut-off frequency and lower than a second cut-off frequency, the second cut-off frequency being higher than the first cut-off frequency, from the AC output signal of said electromagnetic coil, said second high-pass filter comprising a third resistor and a second capacitor connected in series, said third resistor and second capacitor connected in series being connected in parallel with said first resistor; and a third high-pass filter coupled to said electromagnetic coil and said second high-pass filter and having a third cut-off frequency higher than the second cut-off frequency, said third high-pass filter comprising a fourth resistor and a third capacitor connected in series, said fourth resistor and third capacitor connected in series being connected in parallel with said third resistor;

a voltage limiting circuit coupled to said electromagnetic coil and said filter means for switching between the attenuation characteristics of said filter means in response to the amplitude of the AC output signal of said electromagnetic coil by limiting the amplitude of the AC output signal of said electromagnetic coil so that the AC output signal does not exceed a maximum voltage; and a comparator having first and second input terminals for comparing the filtered output signal with a reference voltage and generating a shaped output signal in response, a node connecting said first capacitor to said second resistor being connected to the first input terminal of said comparator and a second node connecting said electromagnetic coil to said second resistor being connected to the second input terminal of said comparator.

5. The waveform shaping circuit according to claim 4 wherein said voltage limiting circuit comprises a pair of diodes connected to each other in reverse polarity and in parallel with said series-connected first capacitor and second resistor.

6. The waveform shaping circuit according to claim 4 wherein the capacitance of said second capacitor is less than the capacitance of said first capacitor.

* * * * *